Figure 1:
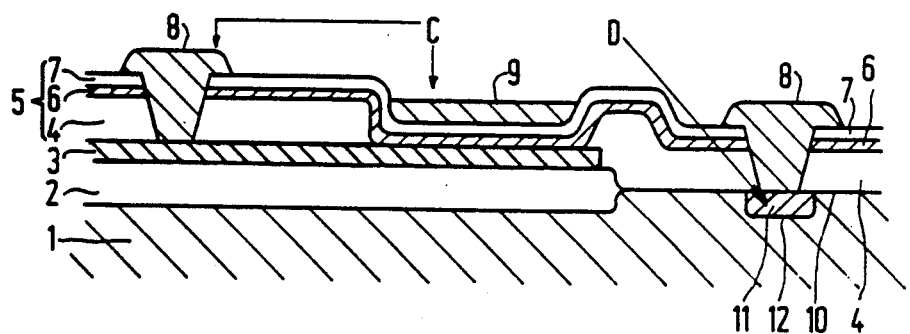

United States Patent [19]

Josquin et al.

[11] Patent Number: 4,997,794
[45] Date of Patent: Mar. 5, 1991

[54] METHOD OF MAKING SEMICONDUCTOR DEVICE COMPRISING A CAPACITOR AND A BURIED PASSIVATION LAYER

[75] Inventors: Wilhelmus J. M. J. Josquin, Eindhoven; Henderikus Lindeman, Nijmegen, both of Netherlands

[73] Assignee: U. S. Philips Corporation, New York, N.Y.

[21] Appl. No.: 435,091

[22] Filed: Nov. 13, 1989

Related U.S. Application Data

[62] Division of Ser. No. 203,675, Jun. 7, 1988, Pat. No. 4,897,707.

[30] Foreign Application Priority Data

Jun. 11, 1987 [NL] Netherlands ............................ 8701357

[51] Int. Cl.[5] ........................................ H01L 21/316
[52] U.S. Cl. ........................................ 437/228; 437/47; 437/60; 437/240; 437/919; 148/DIG. 14
[58] Field of Search ............... 437/60, 919, 228, 236, 437/240, 47; 148/DIG. 14, DIG. 43

[56] References Cited

U.S. PATENT DOCUMENTS

| 3,615,942 | 10/1971 | Blumenfeld | 148/DIG. 43 |
| 4,571,816 | 2/1986 | Dingwall | 148/DIG. 14 |
| 4,621,277 | 11/1986 | Ito et al. | 148/DIG. 112 |

FOREIGN PATENT DOCUMENTS 0228752  12/1984  Japan .

OTHER PUBLICATIONS

Arzubi et al., "Metal-Oxide Semiconductor Capacitor", IBM Tech. Discl. Bull., vol. 17, No. 6, Nov. 1974, pp. 1569-1570.

*Primary Examiner*—Olik Chaudhuri
*Assistant Examiner*—Tuan Nguyen
*Attorney, Agent, or Firm*—Paul R. Miller

[57] ABSTRACT

A semiconductor device comprising a buried phosphor glass layer (5) consisting of a subjacent thick electrically insulating layer (4), a phosphor glass layer (6) and an overlying thin covering layer (7). According to the invention, the thicker electrically insulating layer (4) is locally removed and the combination of phosphor glass layer 6 and covering layer 7 is used as a dielectric for a capacitor. The invention also relates to a method of manufacturing a capacitor with indicated dielectric.

11 Claims, 1 Drawing Sheet

METHOD OF MAKING SEMICONDUCTOR DEVICE COMPRISING A CAPACITOR AND A BURIED PASSIVATION LAYER

This application is a divisional application of parent application Ser. No. 07/203,675, filed Jun. 7, 1988, now U.S. Pat. No. 4,897,707, and all benefits for such earlier application are hereby claimed for this divisional application.

The invention relates to a semiconductor device comprising a semiconductor body having at least one semiconductor circuit element, a surface of the semiconductor body being coated with a passivation layer consisting of a silicon oxide layer, a phosphor glass layer disposed thereon and an electrically insulating covering layer disposed thereon and having a considerably smaller thickness than the silicon oxide layer.

Such a semiconductor device is known from U.S. Pat. No. 3,615,941.

Electrical properties of semiconductor circuit elements, such as breakdown voltage and noise characteristic, can be markedly improved if the surface of these elements is covered by a passivation layer. This layer reduces the surface recombination that may occur due to surface states and electrical charge that may be mobile.

The electrical properties are already considerably improved by providing a silicon oxide layer.

However, the silicon oxide layer often contains ions, which result in that recombination with charge carriers from the semiconductor body nevertheless occurs.

It is further known that by vitrification of a layer of phosphoropentoxide disposed on the silicon oxide layer the aforementioned effect of recombination in the silicon oxide layer is counteracted. The phosphorosilicate glass layer (PSG) formed by heating has immobilized part of the ions originating from the silicon oxide layer (the so-called "getter anneal effect").

The phosphor content in the PSG layer is then generally low. A higher phosphor content leads to a better passivation of the element, it is true, but it also leads to a poorer adhesion of photoresist used in subsequent etching processes.

In order that a passivation layer having a high phosphor content can nevertheless be used, this phosphor glass layer should be enclosed, in order to avoid the aforementioned disadvantages, between layers which do not contain phosphor and consist, for example, of silicon oxide or silicon nitride. The U.S. Pat. No. 3,615,941 discloses such a device, in which a phosphor glass layer is enclosed between a subjacent silicon oxide layer and a thinner overlying covering layer, also of silicon oxide.

The use of a thin covering layer for enclosing the highly doped phosphor glass layer means an additional processing step and consequently in principle a more complicated method. However, this disadvantage would be eliminated if the additional covering layer could be used at the same time to form semiconductor circuit elements to be provided in the semiconductor circuit.

The invention has for its object to use the phosphor glass layer with the thin covering layer disposed thereon also as the dielectric of one or more capacitors forming part of the circuit.

The invention is based on the recognition of the fact that it is possible to form the local interruption of the enclosure of the phosphor glass layer required for this purpose in such a manner that the highly doped phosphor glass layer does not give rise to electrical and/or technological limitations.

According to the invention, a semiconductor device of the kind mentioned in the opening paragraph is characterized in that the device has a silicon layer disposed on an electrically insulating layer and in that the phosphor glass layer with the covering layer is provided at least on part of the silicon layer with, while a metal layer is provided on the covering layer, the silicon layer and the metal layer constituting the plates and the phosphor glass layer with the covering layer constituting the dielectric of a capacitor.

The phosphorus, which is deposited in the usual manner on an insulating silicon oxide layer, is provided at the area of the capacitor to be formed on a silicon layer, which is insulated from the subjacent semiconductor body. The high phosphorus doping in this case does not give rise to problems for the circuit because the silicon layer is used as a (conductive) plate of the capacitor.

The phosphor glass, which can be etched away only with difficulty in connection with the adhesion of photoresist and is therefore present throughout the semiconductor device, has still another object: to render the silicon layer more strongly conducting.

A first preferred embodiment of the semiconductor device according to the invention is characterized in that the semiconductor body consists of silicon and in that the electrically insulating layer is a silicon oxide layer obtained by local oxidation and sunken at least in part in the silicon (LOCOS).

It is achieved by the measure according to the invention that the silicon layer strongly doped by the phosphorus is satisfactorily electrically insulated from the semiconductor body.

A second preferred embodiment of the semiconductor device according to the invention is characterized in that the silicon oxide layer has a thickness of 250-750 nm and the covering layer has a thickness of 25-100 nm.

It is achieved by this measure that the silicon oxide layer is sufficiently thick in order to electrically insulate the wiring and to insulate the phosphorus from the semiconductor body, and in that the covering layer is sufficiently thin to be an effective dielectric for a capacitor.

The invention will now be described more fully with reference to an embodiment and the drawing, in which:

FIG. 1 shows diagrammatically in cross-section a part of a semiconductor device according to the invention, and FIGS. 2 to 5 show diagrammatically in cross-section successive stages of manufacture of the semiconductor device shown in FIG. 1.

The Figures are purely schematic and are not drawn to scale. For the sake of clarity, more particularly the dimensions in the direction of thickness are greatly exaggerated.

Corresponding parts in the Figures are generally designated by like reference numerals. In the cross-sections, semiconductor regions of the same conductivity type are generally cross-hatched in the same direction.

FIG. 1 shows diagrammatically in cross-section a part of a semiconductor device according to the invention. The device has a semiconductor body 1 comprising at least one semiconductor circuit element, in this embodiment at least one diode D. The semiconductor body in this embodiment consists of a substrate of silicon of the p-conductivity type having a doping of $10^{15}$ atoms/cm$^3$ and a thickness of, for example, 500/μm, in which a zone 11 of the opposite conductivity type is formed, which forms with the substrate 1 the planar pn-junction 12 of the diode D. A surface 10 of the substrate is coated with a passivation layer 5 consisting of a silicon oxide layer 4, in this embodiment having a thickness of 400 nm, a phosphor glass layer 6 disposed thereon and an electrically insulating covering layer 7 disposed thereon and consisting in this case of silicon oxide having a considerably smaller thickness than the silicon oxide layer 4, for example a thickness of 75 nm. The phosphor glass layer 6 having a thickness of about 25 nm has a high phosphorus content, in this example of about $10^{21}$ at/cm$^3$. Since, as already stated, such a highly doped phosphor glass layer may give rise to technological and electrical problems, the covering layer 7 is provided.

According to the invention, the device comprises a silicon layer 3 disposed on an electrically insulating layer 2. The insulating layer 2 in this embodiment is a silicon oxide layer, which is obtained by local oxidation of the semiconductor body 1.

The phosphor glass layer 6 is formed with the covering layer 7 on at least a part of the silicon layer 3. Further, a metal layer 9 is formed on the covering layer 7, and metal contacts 8 are provided in contact to silicon layer 3 and diode D. The silicon layer 3 and the metal layer 9 constitute the plates and the phosphor glass layer 6 with the covering layer 7 constitutes the dielectric of a capacitor C (cf. FIG. 1). Due to the fact that the silicon layer 3 is insulated from the semiconductor body 1 by the oxide layer 2, the enclosure of the highly doped phosphor glass layer 6 can be obviated without any risk at the area of the capacitor C, while moreover the heating steps to be carried out during the manufacture can contribute to the conductivity of the silicon layer 3 by diffusion of phosphorus atoms from the phosphor glass layer 6. The semiconductor device described according to the invention can be advantageously manufactured in the following manner.

Figure 2:
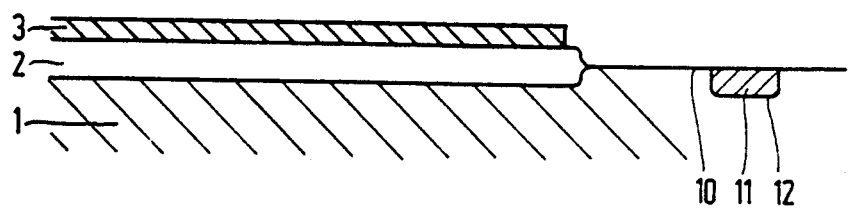
Figure 3:
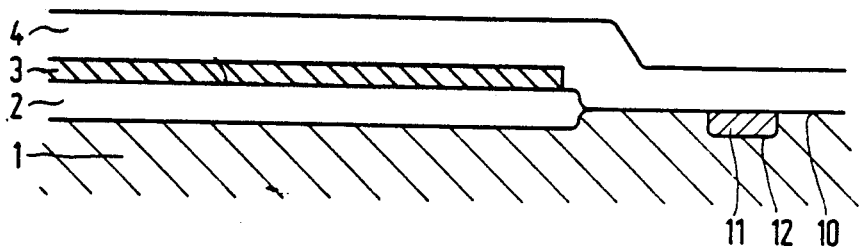

A part of a surface 10 of a semiconductor body 1, in this embodiment of silicon of the p-conductivity type having a doping of $10^{15}$ atoms/cm$^3$ and a thickness of 500/μm, in which a zone 11 of the n-conductivity type is formed, for example by diffusion, is provided in FIG. 2 with an electrically insulating layer 2 consisting in this case of silicon oxide having a thickness of 0.6/μm, which is obtained by selective oxidation of the semiconductor body 1. A silicon layer 3 having in this case a polycrystalline structure is formed on this insulating layer 2 by depositing silicon from the gaseous phase with the use of conventional techniques. The doping of the silicon layer 3 can take place during the deposition of the layer, but also at a later stage by means of diffusion or ion implantation. Subsequently, a silicon oxide layer 4, in this case having a thickness of 0.4/μm, is deposited on the assembly, as seen in FIG. 3, by means of a chemical deposition at low pressure (LPCVD) of tetraethoxy silane, this layer 4 being densified by a temperature treatment, in this case at 950° C. for 10 minutes.

Figure 4:
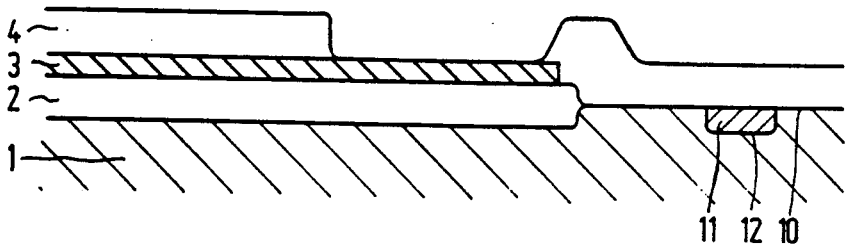
Figure 5:
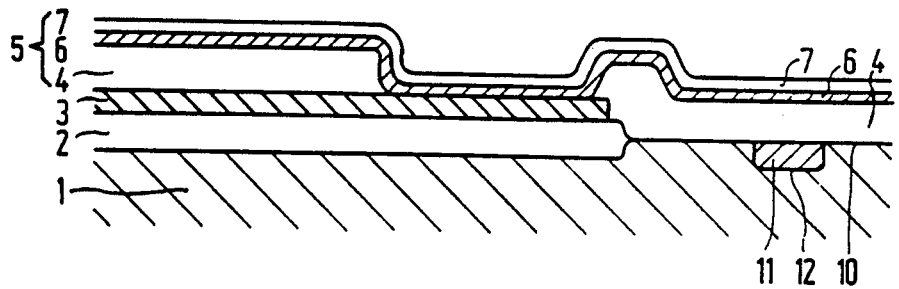

This silicon oxide layer 4 is removed from a part of the surface of the silicon layer 3, in this case by etching, as seen in FIG. 4 whereupon a phosphorus deposition is carried out, for example, by decomposing phosphine at 850° C. for 10 minutes. Thus, a phosphor glass layer 6 is obtained having a high phosphorus content of $10^{21}$ at/cm$^3$.

Subsequently, the assembly is coated with an electrically insulating covering layer 7 consisting in this embodiment of silicon oxide having a thickness of about 75 nm, which is considerably smaller than that of the silicon oxide layer 4.

Subsequently, a temperature treatment is carried out, in this case at a temperature of 950° C., for removing undesired impurities.

Finally, above the silicon layer 3 a metal layer 9 consisting in this case of Al is provided on the covering layer 7.

Contact holes, through which, for example, the diode D and the capacitor C can be reached, can be etched wet chemically into the passivation layer 5 substantially without under-etching occurring at the area of the phosphor glass layer 6.

It will be appreciated that the invention is not limited to the embodiment described, but that within the scope of the invention many variations are possible for a person skilled in the art. Thus, for example, the layer 4 may be replaced by an insulating layer of another material, for example silicon nitride. The semiconductor body may also consist of a semiconductor material other than silicon, for example of gallium arsenide. Further, the covering layer 7 may also consist of an insulating material other than silicon oxide and instead of or together with the diode D a number of other semiconductor circuit elements forming part of an integrated circuit may be present in the semiconductor body.

What is claimed is:

1. A method of manufacturing a semiconductor device comprising the steps of
   (a) selectively oxidizing a part of a surface of a semiconductor body to form at least one oxidized surface portion,
   (b) forming a silicon layer on said oxidized surface portion,
   (c) forming a first silicon oxide layer having a given thickness both over said silicon layer and over a remaining part of said surface of said semiconductor body,
   (d) etching a portion of said first silicon oxide layer overlying a part of said silicon layer to form at least one opening to said silicon layer,
   (e) depositing phosphorous over the entire surface to form a phosphor glass layer having a high phosphor content, said phosphor glass layer contacting said silicon layer in said at least one opening,
   (f) coating said phosphor glass layer with a second silicon oxide layer, said second silicon oxide layer having a considerably smaller thickness than said given thickness,
   (g) annealing said semiconductor body to remove undesired impurities, and
   (h) forming a metal layer above said phosphor glass layer and said silicon layer in said at least one opening to provide at least one capacitor.

2. A method according to claim 1, wherein said first silicon oxide layer is formed by low pressure chemical vapor deposition (LPCVD) of tetraethoxy silane.

3. A method according to claim 2, wherein said first silicon oxide layer is densified by heating at about 950° C. for 10 minutes.

4. A method according to claim 1, wherein said step (e) is carried out by decomposing phosphine at 850° C. for 10 minutes.

5. A method according to claim 4, wherein said step (g) is carried out by heating at a temperature of 950° C. for 60 minutes.

6. A method according to claim 5, wherein at least one diode structure is formed in said surface of said semiconductor surface before said step (a), said diode structure being formed in said remaining part of said surface of said semiconductor body.

7. A method according to claim 1, wherein said step (e) is carried out by decomposing phosphine at 850° C. for 10 minutes.

8. A method according to claim 1, wherein said step (g) is carried out by heating at a temperature of 950° C. for 60 minutes.

9. A method according to claim 1, wherein at least one diode structure is formed in said surface of said semiconductor surface before said step (a), said diode structure being formed in said remaining part of said surface of said semiconductor body.

10. A method according to claim 1, wherein said given thickness ranges from 250 to 750 nm, and said considerably smaller thickness ranges from 25 to 100 nm.

11. A method according to claim 10, wherein said given thickness is approximately 400 nm, and said considerably smaller thickness is approximately 75 nm.

* * * * *